United States Patent
Huang et al.

(10) Patent No.: US 9,030,225 B2
(45) Date of Patent: May 12, 2015

(54) OVER VOLTAGE PROTECTION TESTING APPARATUS

(71) Applicant: Chicony Power Technology Co., Ltd., New Taipei (TW)

(72) Inventors: Chih-Ching Huang, New Taipei (TW); Jhen-Siang Huang, New Taipei (TW); Wen-Nan Huang, New Taipei (TW); Shiu-Hui Lee, New Taipei (TW)

(73) Assignee: Chicony Power Technology Co., Ltd., New Taipei (TW)

( * ) Notice: Subject to any disclaimer, the term of this patent is extended or adjusted under 35 U.S.C. 154(b) by 250 days.

(21) Appl. No.: 13/875,776

(22) Filed: May 2, 2013

(65) Prior Publication Data

US 2014/0327466 A1     Nov. 6, 2014

(51) Int. Cl.
*G01R 31/40* (2014.01)
*G01R 31/28* (2006.01)
*G01R 31/02* (2006.01)
*G01R 31/317* (2006.01)

(52) U.S. Cl.
CPC ............ *G01R 31/40* (2013.01); *G01R 31/2827* (2013.01); *G01R 31/024* (2013.01); *G01R 31/31721* (2013.01)

(58) Field of Classification Search
CPC .. G01R 31/40; G01R 31/42; G01R 31/31721; G01R 31/31924; G01R 31/31922; G01R 31/31937; G01R 19/16538; G01R 31/2805; G01R 31/024; G01R 31/2812; G01R 31/2884; G01R 31/2853
USPC .................. 324/764.01, 750.01, 537, 771
See application file for complete search history.

(56) References Cited

U.S. PATENT DOCUMENTS

| 7,129,759 B2* | 10/2006 | Fukami | 327/110 |
| 8,933,704 B2* | 1/2015 | Bai et al. | 324/606 |
| 2010/0226194 A1* | 9/2010 | Huang | 365/229 |
| 2013/0134985 A1* | 5/2013 | Bernardon | 324/527 |

* cited by examiner

*Primary Examiner* — Huy Q Phan
*Assistant Examiner* — Thang Le
(74) *Attorney, Agent, or Firm* — Muncy, Geissler, Olds & Lowe, P.C.

(57) ABSTRACT

An over voltage protection testing apparatus is applied for testing an over voltage protection function of a power supply apparatus. The over voltage protection testing apparatus mainly includes a voltage boost-storage unit and an energy release unit. The voltage boost-storage unit boosts an original output voltage outputted from the power supply apparatus into a testing voltage. Therefore, no extra testing voltage source is required for testing the over voltage protection function of the power supply apparatus. Moreover, the extra energy would be released to the energy release unit after the testing of the over voltage protection function of the power supply apparatus is finished. Therefore, the energy releasing of the present invention is faster than the energy releasing of a related art.

10 Claims, 3 Drawing Sheets

OVER VOLTAGE PROTECTION TESTING APPARATUS

BACKGROUND OF THE INVENTION

1. Field of the Invention

The present invention relates to a testing apparatus, and especially relates to an over voltage protection testing apparatus.

2. Description of the Related Art

A power supply apparatus is a very common electronic apparatus. Besides supplying power, the power supply apparatus has many other functions, such as over voltage protection function.

The over voltage protection function very important for the power supply apparatus. Therefore, testing the over voltage protection function of the power supply apparatus is also very important. Generally speaking, an over voltage protection testing apparatus is used for testing the over voltage protection function of the power supply apparatus.

However, the over voltage protection testing apparatus of the related art includes following disadvantages.

1. An extra testing voltage source is required for testing the over voltage protection function of the power supply apparatus.

2. The extra energy is released slowly after the testing of the over voltage protection function of the power supply apparatus is finished.

3. The circuit structure is complicated and costly.

SUMMARY OF THE INVENTION

In order to solve the above-mentioned problems, an object of the present invention is to provide an over voltage protection testing apparatus.

In order to achieve the object of the present invention mentioned above, the over voltage protection testing apparatus of the present invention is applied to a power supply apparatus. The power supply apparatus is electrically connected to the over voltage protection testing apparatus. The over voltage protection testing apparatus includes a test contact, a voltage detecting unit, an energy release unit, a switch unit, a voltage boost-storage unit, and a microprocessor. The test contact is electrically connected to the power supply apparatus. The voltage detecting unit is electrically connected to the test contact. The energy release unit is electrically connected to the test contact. The switch unit is electrically connected to the test contact. The voltage boost-storage unit is electrically connected to the test contact and the switch unit. The microprocessor is electrically connected to the voltage detecting unit, the energy release unit, the switch unit, and the voltage boost-storage unit. The power supply apparatus outputs an original output voltage to the test contact. The voltage detecting unit is configured to detect the original output voltage and inform the microprocessor. The microprocessor is configured to record a voltage value of the original output voltage. The voltage boost-storage unit boosts the original output voltage into a testing voltage and stores the testing voltage. The microprocessor is configured to control the energy release unit and the switch unit. The energy release unit is not conducted and the power supply apparatus receives the testing voltage when the switch unit is conducted. Therefore, an over voltage protection function of the power supply apparatus is tested. The voltage detecting unit is configured to detect a voltage of the test contact and inform the microprocessor. The microprocessor is informed that the power supply apparatus is turned off due to the over voltage protection function when the voltage value of the original output voltage recorded in the microprocessor minus the voltage value of the test contact is larger than a predetermined value. The energy release unit is conducted and the power supply apparatus releases energy through the energy release unit when the switch unit is not conducted.

Moreover, the voltage boost-storage unit includes a voltage boost subunit electrically connected to the test contact and the microprocessor. The voltage boost subunit is used to boost the original output voltage into the testing voltage. The microprocessor is configured to control the voltage boost subunit to boost the testing voltage when the voltage value of the original output voltage recorded in the microprocessor minus the voltage value of the test contact is not larger than the predetermined value.

Moreover, the voltage boost-storage unit further includes a voltage storage subunit electrically connected to the voltage boost subunit, the microprocessor, and the switch unit. The voltage storage subunit is used to store the testing voltage. The microprocessor is configured to control the voltage storage subunit to output the testing voltage.

Moreover, the energy release unit includes a switch subunit electrically connected to the test contact and the microprocessor. The energy release unit is conducted when the microprocessor is configured to conduct the switch subunit. The energy release unit is not conducted when the microprocessor is not configured to conduct the switch subunit.

Moreover, the energy release unit further includes an energy release subunit electrically connected to the switch subunit and the microprocessor.

Moreover, the energy release subunit is, for example but not limited to, a variable resistor circuit. The microprocessor is configured to control a resistance value of the variable resistor circuit.

Moreover, the over voltage protection testing apparatus further includes a display unit electrically connected to the microprocessor.

Moreover, the voltage detecting unit is, for example but not limited to, a voltage detecting circuit. The display unit is, for example but not limited to, a monitor. The voltage boost subunit is, for example but not limited to, a voltage boost circuit. The voltage storage subunit is, for example but not limited to, a voltage storage circuit.

Moreover, the switch unit is, for example but not limited to, a metal oxide semiconductor field effect transistor (MOSFET), an insulation gate bipolar transistor (IGBT), a silicon controlled rectifier (SCR), or a bipolar junction transistor (JUT).

Moreover, the switch subunit is, for example but not limited to, a metal oxide semiconductor field effect transistor, an insulation gate bipolar transistor, a silicon controlled rectifier, or a bipolar junction transistor.

DETAILED DESCRIPTION OF THE INVENTION

Figure 1:
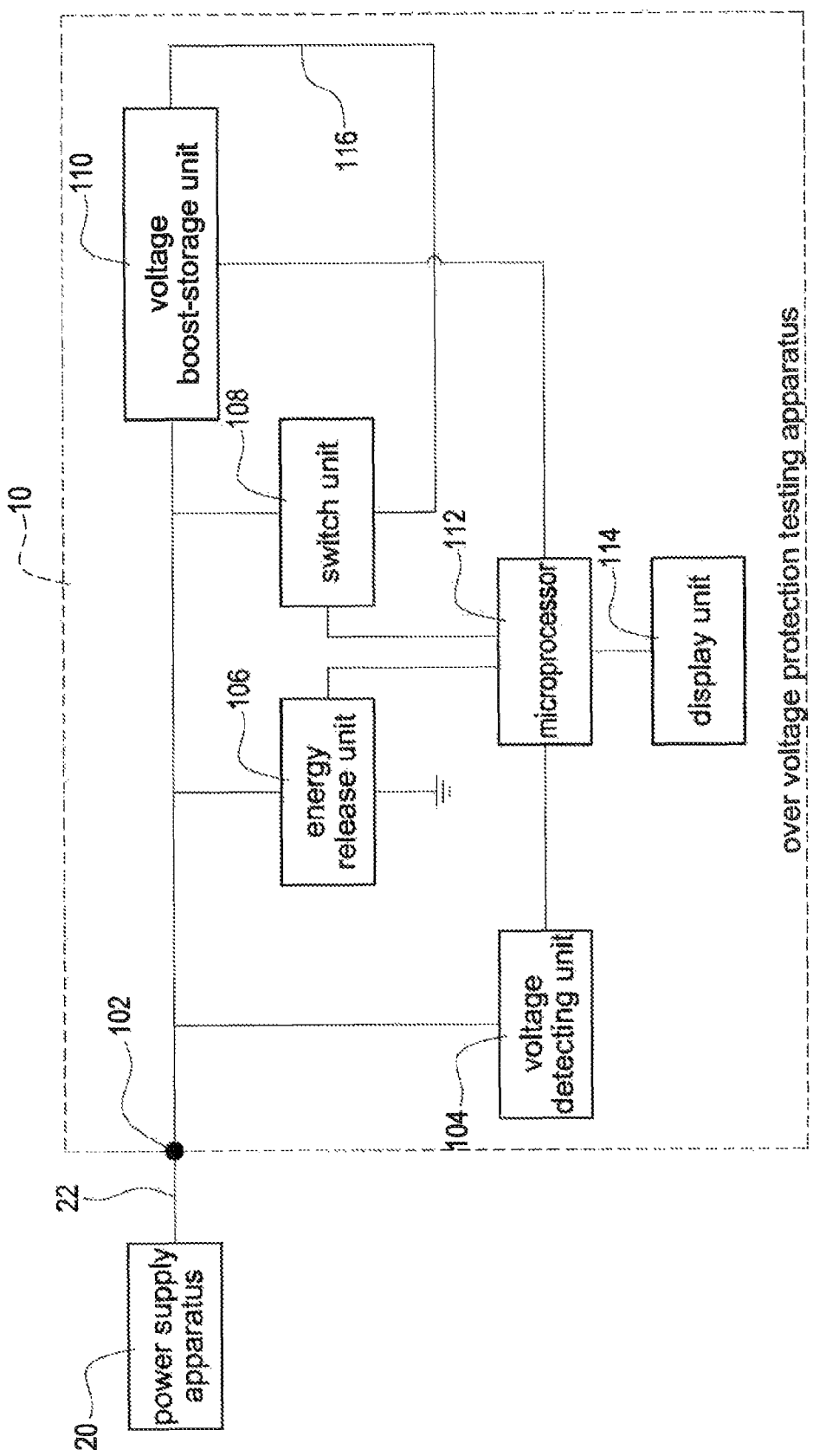
FIG. 1 shows a block diagram of the over voltage protection testing apparatus of the present invention.

FIG. 1 shows a block diagram of the over voltage protection testing apparatus of the present invention. An over voltage protection testing apparatus 10 is applied to a power supply apparatus 20. The power supply apparatus 20 is electrically connected to the over voltage protection testing apparatus 10.

The over voltage protection testing apparatus 10 includes a test contact 102, a voltage detecting unit 104, an energy release unit 106, a switch unit 108, a voltage boost-storage unit 110, a microprocessor 112, and a display unit 114.

The test contact 102 is electrically connected to the power supply apparatus 20, the voltage detecting unit 104, the energy release unit 106, the switch unit 108, and the voltage boost-storage unit 110. The microprocessor 112 is electrically connected to the voltage detecting unit 104, the energy release unit 106, the switch unit 108, the voltage boost-storage unit 110, and the display unit 114. The voltage boost-storage unit 110 is electrically connected to the switch unit 108.

Figure 2:
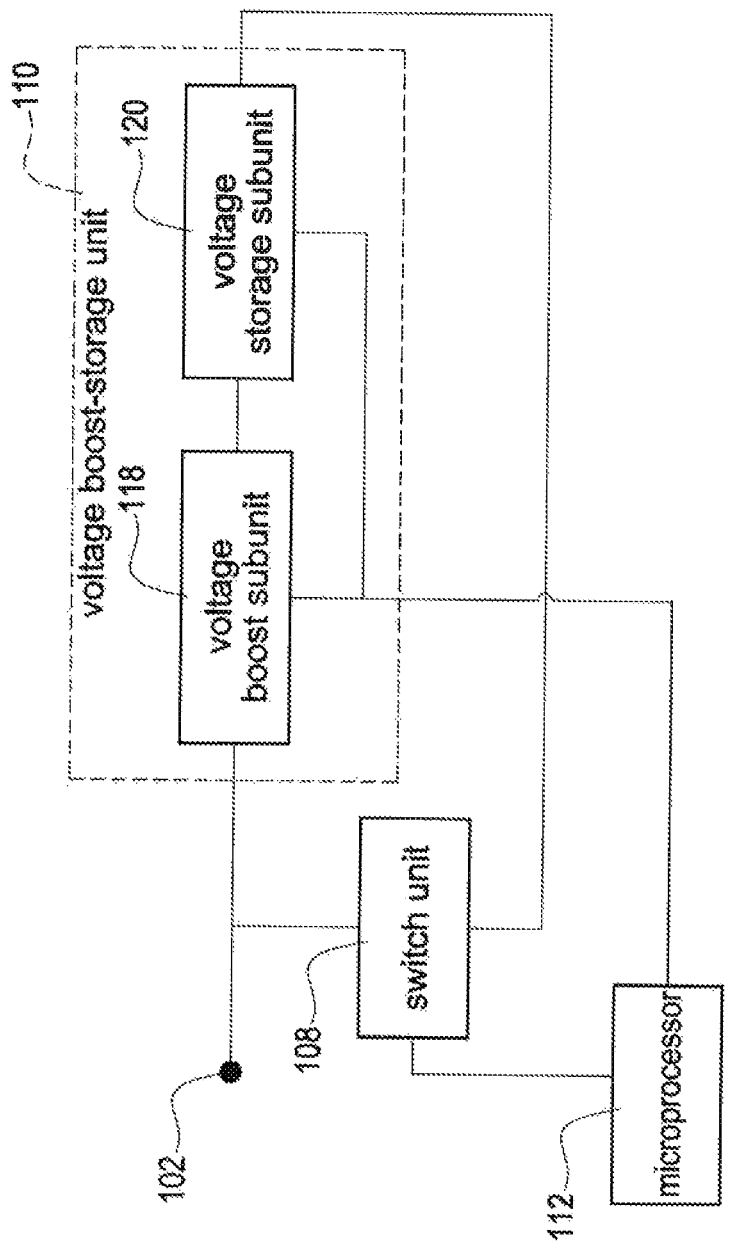
FIG. 2 shows a block diagram of the voltage boost-storage unit of the present invention.

FIG. 2 shows a block diagram of the voltage boost-storage unit of the present invention. The voltage boost-storage unit 110 includes a voltage boost subunit 118 and a voltage storage subunit 120. The voltage boost subunit 118 is electrically connected to the test contact 102 and the microprocessor 112. The voltage storage subunit 120 is electrically connected to the voltage boost subunit 118, the microprocessor 112, and the switch unit 108.

Figure 3:
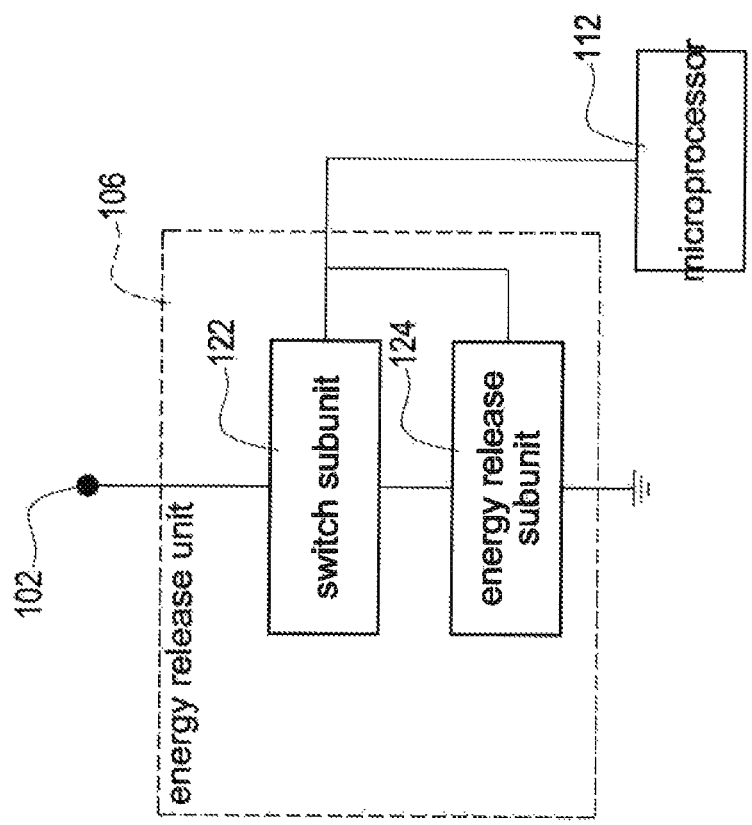
FIG. 3 shows a block diagram of the energy release unit of the present invention.

FIG. 3 shows a block diagram of the energy release unit of the present invention. Please refer to FIG. 1 and FIG. 2 as well. The energy release unit 106 includes a switch subunit 112 and an energy release subunit 124. The switch subunit 122 is electrically connected to the test contact 102 and the microprocessor 112. The energy release subunit 124 is electrically connected to the switch subunit 122 and the microprocessor 112.

A voltage output side of the power supply apparatus 20 is connected to the test contact 102 when the over voltage protection function of the power supply apparatus 20 is tested. Then, the power supply apparatus 20 is turned on. The power supply apparatus 20 outputs an original output voltage 22 (for example 12 volts) to the test contact 102.

The voltage detecting unit 104 is configured to detect the original output voltage 22 and inform the microprocessor 112. The microprocessor 112 is configured to record a voltage value of the original output voltage 22. For example, the microprocessor 112 is configured to record that the voltage value of the original output voltage 22 is 12 volts.

The voltage boost-storage unit 110 is used to boost the original output voltage 22 into a testing voltage 116 and store the testing voltage 116.

More specifically, the voltage boost subunit 118 is used to boost the original output voltage 22 into the testing voltage 116. The voltage storage subunit 120 is used to store the testing voltage 116. The microprocessor 112 is configured to control the voltage storage subunit 120 to output the testing voltage 116. The microprocessor 112 is configured to control the voltage boost subunit 118 to boost or reduce the testing voltage 116.

The microprocessor 112 is configured to control the energy release unit 106 and the switch unit 108. The energy release unit 106 is not conducted when the switch unit 108 is conducted. The energy release unit 106 is conducted when the switch unit 108 is not conducted.

Moreover, the energy release unit 106 is conducted when the microprocessor 112 is configured to conduct the switch subunit 122. The energy release unit 106 is not conducted when the microprocessor 112 is not configured to conduct the switch subunit 122.

The energy release subunit 124 is, for example but not limited to, a variable resistor circuit. The microprocessor 112 is configured to control a resistance value of the variable resistor circuit. The energy release subunit 124 could be a resistor as well.

Therefore, the energy of the testing voltage 116 is not released when the over voltage protection function of the power supply apparatus 20 is tested (the switch unit 108 is conducted, and the energy release unit 106 is not conducted). The power supply apparatus 0 receives the testing voltage 116 to test the over voltage protection function of the power supply apparatus 20.

The energy of an output side capacitor (not shown in FIG. 1) of the power supply apparatus 20 is released to the energy release unit 106 when the testing of the over voltage protection function of the power supply apparatus 20 is finished (the switch unit 108 is not conducted, and the energy release unit 106 is conducted).

The energy release unit 106 is not conducted and the power supply apparatus 20 receives the testing voltage 116 when the switch unit 108 is conducted. Therefore, the over voltage protection function of the power supply apparatus 20 is tested.

The power supply apparatus 20 is turned off when the testing voltage 116 is larger than a trigger voltage (for example 18 volts) of the over voltage protection function of the power supply apparatus 20. Therefore, the power supply apparatus 20 stops outputting the original output voltage 22 to the test contact 102. A voltage value of the test contact 102 is dropped to zero (the energy is released to the energy release unit 106).

The power supply apparatus 20 is not turned off when the testing voltage 116 is not larger than the trigger voltage (for example 18 volts) of the over voltage protection function of the power supply apparatus 20. Therefore, the power supply apparatus 20 continues to output the original output voltage 22 to the test contact 102. The voltage value of the test contact 102 is boosted to the voltage value of the testing voltage 116, and then dropped to the voltage value of the original output voltage 22. The energy (resulted from the testing voltage 116) of the output side capacitor of the power supply apparatus 20 is released to the energy release unit 106.

The voltage detecting unit 104 is configured to detect the voltage of the test contact 102 and inform the microprocessor 112. The microprocessor 112 is configured to judge whether the testing voltage 116 is large enough to trigger the over voltage protection function of the power supply apparatus 20.

The microprocessor 112 is informed that the power supply apparatus 20 is turned off due to the over voltage protection function when the voltage value (for example 12 volts) of the original output voltage 22 recorded in the microprocessor 112 minus the voltage value of the test contact 102 is larger than a predetermined value. The predetermined value is larger than zero and is any number (for example 3 volts).

For example, the testing voltage 116 (for example 19 volts) is larger than the trigger voltage (for example 18 volts) of the over voltage protection function of the power supply apparatus 20. The power supply apparatus 20 is turned off. The voltage detecting unit 104 detects that the voltage value of the test contact 102 is dropped to zero gradually.

The microprocessor 112 is informed that the power supply apparatus 20 is turned of due to the over voltage protection function when the voltage detecting unit 104 detects that the voltage of the test contact 102 is dropped to 9 volts (12−3=9).

The microprocessor 112 is configured to control the voltage boost subunit 118 to boost the testing voltage 116 to find out the value of the trigger voltage of the over voltage protection function of the power supply apparatus 20 when the voltage value (for example 12 volts) of the original output voltage 22 recorded in the microprocessor 112 minus the voltage value of the test contact 102 is not larger than the predetermined value (the over voltage protection function of the power supply apparatus 20 is not yet triggered).

For example, the testing voltage 116 (for example 15 volts) is smaller than the trigger voltage (for example 18 volts) of the over voltage protection function of the power supply apparatus 20. The power supply apparatus 20 is not turned off. The voltage value of the test contact 102 is dropped to the voltage value of the original output voltage 22 (for example 12 volts) gradually. The voltage detecting unit 104 detects that the voltage value of the test contact 102 is 12 volts. The microprocessor 112 is configured to control the voltage boost subunit 118 to boost the testing voltage 116 to find out the value of the trigger voltage of the over voltage protection function of the power supply apparatus 20.

Generally speaking, the voltage value of the testing voltage 116 is changed increasingly (from small voltage to large voltage) in order to find out the value of the trigger voltage of the over voltage protection function of the power supply apparatus 20.

Moreover, the display unit 114 is, for example but not limited to, a monitor. The display unit 114 is used to display information, such as the original output voltage 22, the testing voltage 116, the status of the power supply apparatus 20 (in working status or shutdown status due to over voltage protection), and so on.

The voltage detecting unit 104 is, for example but not limited to, a voltage detecting circuit. The voltage boost subunit 118 is, for example but not limited to, a voltage boost circuit. The voltage storage subunit 120 is, for example but not limited to, a voltage storage circuit.

The switch unit 108 is, for example but not limited to, a metal oxide semiconductor field effect transistor (MOSFET), an insulation gate bipolar transistor (IGBT), a silicon controlled rectifier (SCR), or a bipolar junction transistor (BJT).

The switch subunit 122 is, for example but not limited to, a metal oxide semiconductor field effect transistor, an insulation gate bipolar transistor, a silicon controlled rectifier, or a bipolar junction transistor.

The present invention includes following features.

1. The voltage boost-storage unit 110 is used to boost the original output voltage 22 (outputted from the power supply apparatus 20) into the testing voltage 116. Therefore, no extra testing voltage source is required for testing the over voltage protection function of the power supply apparatus 20.

2. The extra energy is released to the energy release unit 106 after the testing of the over voltage protection function of the power supply apparatus 20 is finished. Therefore, the extra energy is released faster and the efficiency of the testing is higher than the related art. Moreover, the microprocessor 112 is configured to control the resistance value of the variable resistor circuit to control the time of the releasing energy.

3. The circuit structure is simple and inexpensive.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An over voltage protection testing apparatus applied to a power supply apparatus electrically connected to the over voltage protection testing apparatus, the over voltage protection testing apparatus including:

a test contact electrically connected to the power supply apparatus;

a voltage detecting unit electrically connected to the test contact;

an energy release unit electrically connected to the test contact;

a switch unit electrically connected to the test contact;

a voltage boost-storage unit electrically connected to the test contact and the switch unit; and a microprocessor electrically connected to the voltage detecting unit, the energy release unit, the switch unit, and the voltage boost-storage unit, wherein the power supply apparatus outputs an original output voltage to the test contact; the voltage detecting unit is configured to detect the original output voltage and inform the microprocessor; the microprocessor is configured to record a voltage value of the original output voltage; the voltage boost-storage unit boosts the original output voltage into a testing voltage and stores the testing voltage; the microprocessor is configured to control the energy release unit and the switch unit; the energy release unit is not conducted and the power supply apparatus receives the testing voltage when the switch unit is conducted; an over voltage protection function of the power supply apparatus is tested; the voltage detecting unit is configured to detect a voltage of the test contact and inform the microprocessor; the microprocessor is informed that the power supply apparatus is turned of due to the over voltage protection function when the voltage value of the original output voltage recorded in the microprocessor minus the voltage value of the test contact is larger than a predetermined value; the energy release unit is conducted and the power supply apparatus releases energy through the energy release unit when the switch unit is not conducted.

2. The over voltage protection testing apparatus in claim 1, wherein the voltage boost-storage unit includes a voltage boost subunit electrically connected to the test contact and the microprocessor; the voltage boost subunit boosts the original output voltage into the testing voltage; the microprocessor is configured to control the voltage boost subunit to boost the testing voltage when the voltage value of the original output voltage recorded in the microprocessor minus the voltage value of the test contact is not larger than the predetermined value.

3. The over voltage protection testing apparatus in claim 2, wherein the voltage boost-storage unit further includes a voltage storage subunit electrically connected to the voltage boost subunit, the microprocessor, and the switch unit; the voltage storage subunit stores the testing voltage; the microprocessor is configured to control the voltage storage subunit to output the testing voltage.

4. The over voltage protection testing apparatus in claim 3, wherein the energy release unit includes a switch subunit electrically connected to the test contact and the microprocessor; the energy release unit is conducted when the microprocessor is configured to conduct the switch subunit; the energy release unit is not conducted when the microprocessor is not configured to conduct the switch subunit.

5. The over voltage protection testing apparatus in claim 4, wherein the energy release unit further includes an energy release subunit electrically connected to the switch subunit and the microprocessor.

6. The over voltage protection testing apparatus in claim 5, wherein the energy release subunit is a variable resistor circuit; the microprocessor is configured to control a resistance value of the variable resistor circuit.

7. The over voltage protection testing apparatus in claim 6, further including a display unit electrically connected to the microprocessor.

8. The over voltage protection testing apparatus in claim 7, wherein the voltage detecting unit is a voltage detecting circuit; the display unit is a monitor; the voltage boost subunit is a voltage boost circuit; the voltage storage subunit is a voltage storage circuit.

9. The over voltage protection testing apparatus in claim 8, wherein the switch unit is a metal oxide semiconductor field effect transistor, an insulation gate bipolar transistor, a silicon controlled rectifier, or a bipolar junction transistor.

10. The over voltage protection testing apparatus in claim 9, wherein the switch subunit is a metal oxide semiconductor field effect transistor, an insulation gate bipolar transistor, a silicon controlled rectifier, or a bipolar junction transistor.

\* \* \* \* \*